United States Patent
Seki et al.

(10) Patent No.: US 8,999,218 B2
(45) Date of Patent: Apr. 7, 2015

(54) PROCESS FOR PRODUCING MEMBER HAVING PATTERN, PATTERN TRANSFER APPARATUS, AND MOLD

(75) Inventors: Junichi Seki, Yokohama (JP); Masao Majima, Isehara (JP); Nobuhito Suehira, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 2448 days.

(21) Appl. No.: 11/410,892

(22) Filed: Apr. 26, 2006

(65) Prior Publication Data
US 2006/0272535 A1 Dec. 7, 2006

(30) Foreign Application Priority Data
Jun. 6, 2005 (JP) ................................. 2005-166038

(51) Int. Cl.
| | |
|---|---|
| B28B 11/10 | (2006.01) |
| B29C 43/14 | (2006.01) |
| B29C 59/02 | (2006.01) |
| B82Y 10/00 | (2011.01) |
| B82Y 40/00 | (2011.01) |
| G03F 7/00 | (2006.01) |
| B28B 11/24 | (2006.01) |

(Continued)

(52) U.S. Cl.
CPC ........... B29C 43/14 (2013.01); B29C 2043/144 (2013.01); B29C 2043/025 (2013.01); B29C 43/021 (2013.01); B29C 59/022 (2013.01); B82Y 10/00 (2013.01); B82Y 40/00 (2013.01); G03F 7/0002 (2013.01)

(58) Field of Classification Search
USPC ......... 264/319, 293, 294, 296, 330, 494, 496; 101/490
See application file for complete search history.

(56) References Cited

U.S. PATENT DOCUMENTS

| | | | |
|---|---|---|---|
| 5,772,905 A | 6/1998 | Chou | 216/44 |
| 6,943,117 B2 * | 9/2005 | Jeong et al. | 438/694 |

(Continued)

FOREIGN PATENT DOCUMENTS

| | | | |
|---|---|---|---|
| JP | 2005-116022 | 4/2005 | |
| JP | 2005100499 A * | 4/2005 | G11B 5/84 |

OTHER PUBLICATIONS

Machine Translation of JP 2005-100499, Sakurai et al., Apr. 2005.*

(Continued)

*Primary Examiner* — Atul P. Khare
(74) *Attorney, Agent, or Firm* — Fitzpatrick, Cella, Harper & Scinto (57) ABSTRACT

A process of producing a member having a pattern. The process includes preparing a first mold having a pattern surface provided with a first uneven pattern at a surface of the first mold, and preparing a second mold having a pattern surface, provided with a second uneven pattern at a surface of the second mold, including a shape portion corresponding to an outer peripheral shape of the pattern surface provided with the first uneven pattern. When the pattern is transferred onto the member in a transfer area including (i) a peripheral area, which is an area not large enough to transfer an entire first uneven pattern of the first mold, and (ii) an area inside the peripheral area, in the area inside the peripheral area, the first uneven pattern of the first mold is transferred plural times to form a pattern group of the first uneven patterns, and in the peripheral area, the second uneven pattern of the second mold, including a shape portion corresponding to an outer peripheral shape of the pattern group, is transferred.

10 Claims, 10 Drawing Sheets

(51) Int. Cl.
    *B29C 35/08* (2006.01)
    *B29C 43/02* (2006.01)

(56) References Cited

U.S. PATENT DOCUMENTS

| | | | | |
|---|---|---|---|---|
| 7,780,893 | B2* | 8/2010 | Sreenivasan et al. | 264/293 |
| 7,802,978 | B2* | 9/2010 | Sreenivasan et al. | 425/149 |
| 7,878,791 | B2* | 2/2011 | Simon et al. | 425/345 |
| 7,935,292 | B2* | 5/2011 | Sreenivasan et al. | 264/293 |
| 8,221,665 | B2* | 7/2012 | Rudmann et al. | 264/227 |
| 2004/0124566 | A1* | 7/2004 | Sreenivasan et al. | 264/494 |
| 2004/0192041 | A1* | 9/2004 | Jeong et al. | 438/689 |
| 2005/0230346 | A1* | 10/2005 | Kasumi et al. | 216/44 |
| 2006/0259546 | A1* | 11/2006 | Rudmann et al. | 709/203 |
| 2007/0200276 | A1* | 8/2007 | Mackey et al. | 264/293 |

OTHER PUBLICATIONS

Lee et al. Full wafer scale near zero residual nano-imprinting lithography using UV curable monomer solution. Microelectronic Engineering 77 (2005) 42-47).*
Chou, Stephen Y., et al., "*Imprint of sub-25 nm vias and trenches in polymers*," Appl. Phys. Lett. 67 (21), Nov. 20, 1995. pp. 3114-3116.
McMackin, Ian, et al., "*Design and Performance of a Step and Repeat Imprinting Machine*," SPIE Microlithography Conference, Feb. 2003. Nine pages, total.

* cited by examiner

PROCESS FOR PRODUCING MEMBER HAVING PATTERN, PATTERN TRANSFER APPARATUS, AND MOLD

This application claims priority from Japanese Patent Application No. 2005-166038, filed Jun. 6, 2005, which is hereby incorporated by reference.

FIELD OF THE INVENTION AND RELATED ART

The present invention relates to a process of producing a member having a pattern, a pattern transfer apparatus, and a mold.

In recent years, as described in Stephan Y Chou, et al., Appl. Phys. Lett., Vol. 67, Issue 21, pages 3114-3116 (1995), nanofabrication technology for transferring a minute structure on a mold onto a member to be processed, such as resin, metal, etc., under pressure, has been developed and has received attention.

This technology is called nanoprinting or nanoembossing, and has a resolution on the order of several nanometers, so that it has received attention as a next-generation semiconductor fabrication technology in place of using a light exposure device, such as a stepper, a scanner, etc. Further, a steric (three-dimensional) structure can be integrally processed at a wafer level, so that the nanofabrication technology is expected to be applied to a wide range of fields including an optical device, such as a photonic crystal, and a biochip, such as μ-TAS.

Further, Design and Performance of a Step and Repeat Imprinting Machine, SPIE Microlithography Conference, February 2003, has proposed such a processing method that a minute structure is formed at a surface of a quartz substrate smaller than a work, to prepare a mold, which is irradiated with UV light, while being pressed against a substrate, onto which a UV curable resin is applied, so that the UV curable resin is solidified and the minute structure and the mold is transferred onto the UV resin substrate. The same operation is repeated by moving the work reactive to the mold by means of a stage, whereby the work is processed into a member as the light exposure device, such as the stepper or the scanner. Such a repetition of the operation is generally referred to as a "step-and-repeat method".

However, in a case when pattern formation is performed through a step-and-repeat method by using a mold having a pattern area smaller in size than a work (e.g., a silicon substrate), there is a possibility that the following problem arises.

Figure 4A:
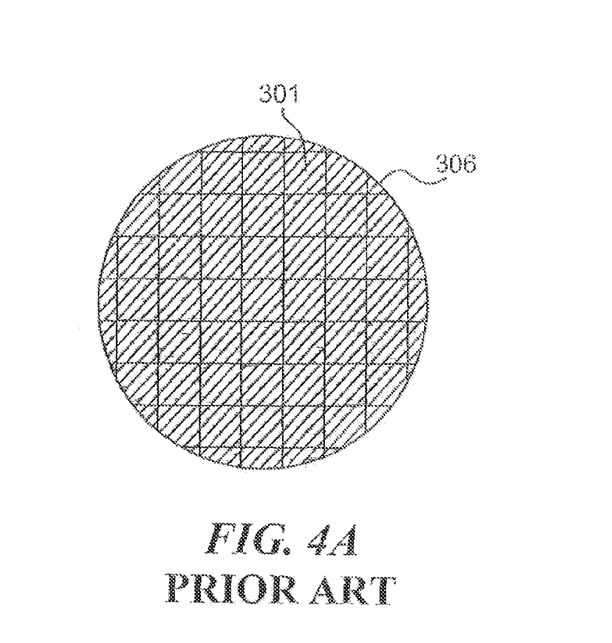
FIGS. 4A and 4B are schematic views for illustrating a conventional processing method.

More specifically, generally, in a processing method using a light exposure apparatus, it is possible to form a pattern by effecting exposure to light also at an edge (end) portion 306 of a work (wafer), as shown in FIG. 4A. This is realized by irradiating the work, even at a peripheral portion thereof, with light according to a reticle pattern identical to that in the neighborhood of a center.

However, in the processing method in the Design and Performance article described above, when a peripheral area 302 (FIG. 4B) of the work is processed with a mold identical to a mold used for processing an inner area of the work, there is a possibility of occurrences of breakage and processing failure of the mold, due to a stress concentration.

Figure 4B:
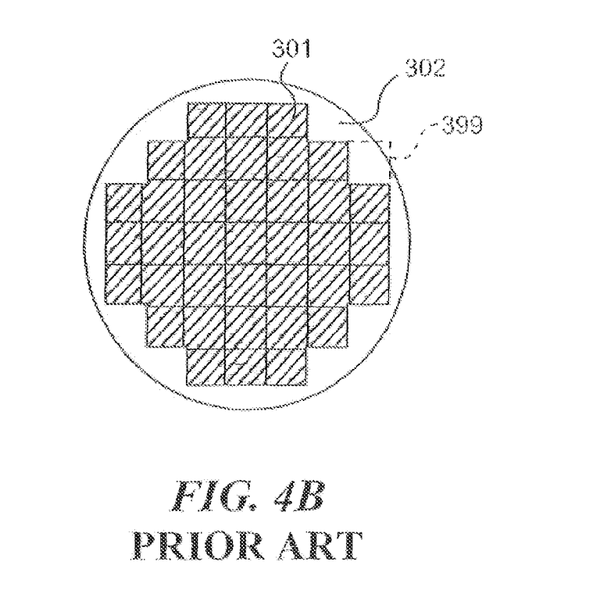

This is because a pressure is exerted between the mold and the work in an imprint method, so that there is a possibility that breakage of the mold and processing failure occur due to an uneven load caused by a stress concentration at the edge portion of the work. Accordingly, in a conventional nanoimprint method, as shown in FIG. 4B, the step-and-repeat method is performed so as not to form a pattern in the peripheral area 302 as the peripheral portion of the work. Further, in a case when a pattern is forcedly formed in the peripheral area 302 by using the mold for forming the pattern at a non-peripheral portion (e.g., a portion in the neighborhood of a central portion of the wafer), there is a possibility of the mold breaking. The mold, having an uneven pattern surface for forming a pattern group by the step-and-repeat method, is generally very expensive, depending on a line width and a pitch of the uneven pattern formed. For this reason, it is desired that a mold less liable to be broken is used.

Incidentally, pattern formation at the edge portion of the work (wafer) or in the neighborhood thereof is called a peripheral shot or an edge shot in the field of photolithography. The pattern formed in the peripheral area of the wafer has a function of improving uniformity in a process, such as dry etching or ion implantation, affected by roughness or the size of a peripheral pattern. Further, also in other processes, the pattern functions as a test pattern, so that it is preferable that the pattern formation in the peripheral area of the work is also performed in the nanoimprint method.

SUMMARY OF THE INVENTION

In view of the above-described circumstances, the present invention has been accomplished by separately preparing a mold for effecting imprinting in a peripheral area of a work in addition to a mold for forming a pattern in a non-peripheral area of the work.

An object of the present invention is to provide a novel production process, for a member having a pattern, having solved the above-described problem.

Another object of the present invention is to provide a pattern transfer apparatus and a mold, which are capable of being used in the production process.

Incidentally, in the present invention, a pattern is not necessarily required to be formed in an entire peripheral area of a work (or workplace).

According to an aspect of the present invention, a process for producing a member having a pattern comprises:

preparing a first mold having a first pattern at a surface thereof;

preparing a second mold having a second pattern including an outer peripheral portion having a shape corresponding to a shape of an outer peripheral portion of the first pattern;

transferring the second pattern to a peripheral area, of a member to be subjected to pattern transfer, which is an area not large enough to transfer an entire first pattern of the first mold; and transferring the first pattern to an inside of the peripheral area.

The first pattern and the second pattern may be disposed adjacent to each other at a spacing identical to a spacing between adjacent portions of the first pattern formed inside the peripheral area.

In a case when the first pattern has an outer peripheral portion constituted by straight line segments, the second pattern may preferably have an outer peripheral portion constituted by straight line segments corresponding to those of the outer peripheral portion f the first pattern and a curved line corresponding to that of a peripheral edge portion of the member.

According to another aspect of the present invention, a process of producing a member having a pattern by transferring a pattern shape of a mold onto a member to be processed under pressure comprises:

forming a second pattern in a peripheral area of the member to be processed; and transferring a first pattern plural times in an area located inside the peripheral area of the member to be processed by using a mold having the first pattern. The second pattern formation may be performed by pattern transfer with the mold or by other methods, such as etching.

According to another aspect of the present invention, a process of producing a member having a pattern comprises:

forming a second pattern corresponding to an outer peripheral shape of a pattern group in a peripheral area of a member before or after a first pattern of a mold is transferred plural times onto the member to form the pattern group. The member may, e.g., be a flat plate-like member.

According to another aspect of the present invention, a pattern transfer apparatus, for transferring a pattern of a mold onto a member, comprises:

a first mold having a portion for holding a first mold for forming a pattern inside a peripheral area of the member; and a second mold holding portion for holding a second mold for forming a pattern in the peripheral area.

According to another aspect of the present invention, a mold is provided with a pattern having an outer periphery comprising a first outer peripheral portion constituted by a curved line segment and a second outer peripheral portion constituted by a straight line segment.

According to another aspect of the present invention, a mold is provided with a pattern corresponding to an outer peripheral shape of a pattern group constituted by a plurality of pattern surfaces each having a rectangular outer peripheral portion.

According to an aspect of the present invention, a process of producing a member having a pattern comprises:

preparing a first mold having a first pattern, comprising a plurality of pattern units, at a surface thereof;

preparing a second mold having a second pattern including an outer peripheral portion having a shape corresponding to a shape of an outer peripheral portion of the plurality of pattern units of the first pattern;

transferring the second pattern to a peripheral area, of a member to be subjected to pattern transfer, which is an area not large enough to transfer an entire pattern unit of the first pattern of the first mold; and transferring the first pattern to an inside of the peripheral area.

Further, in an order to solve the above-described problem, the present invention provides a process for producing a member provided with an unevenness, a pressure processing apparatus, and a mold, which are constituted as described below.

The process for producing a member provided with an unevenness according to the present invention is a production process for transferring a pattern shape of a mold onto a member to be processed (work or wafer) by pressure application and includes a step of pressing an outer peripheral area of the work (member to be processed) and a step of pressing an area located inside the outer peripheral area of the work. In this peripheral pattern, it is possible to adopt a constitution such that an entire area of the work is processed by the respective steps.

Further, the pressure processing apparatus of the present invention is an apparatus for transferring a pattern shape of a mold onto the work by pressure application, and is characterized in that an outer peripheral area pressing means is provided for pressing an outer peripheral area of the work and an inner area pressing means is provided for pressing an area located inside the outer peripheral area of the work.

Further, the mold of the present invention is characterized in that it has a shape depending on an outer peripheral shape of an uneven peripheral area formed on the work.

The mold, on which an uneven pattern is formed, is also characterized in that it has a first surface and a second surface, which are perpendicular to a pattern formed surface of the uneven pattern and are disposed opposite to each other, and at least one of the first surface and the second surface has a bent shape.

The first surface may be a curved surface and the second surface may be a non-curved surface.

Further, the mold having thereon the uneven pattern may be provided with a light-blocking film outside an area in which the uneven pattern is formed.

According to the present invention, it is possible to appropriately form the uneven pattern in not only the inner area of the work, but also, the outer peripheral area of the work.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Embodiments of a Mold

Figure 6A:
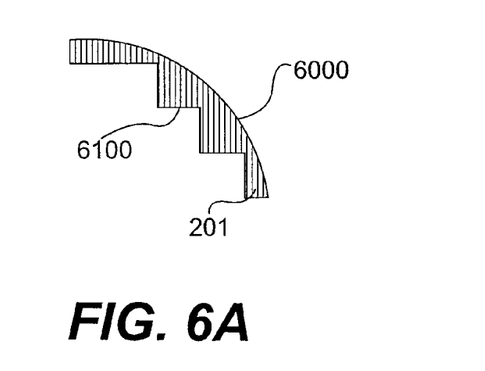
FIGS. 6A to 6C are schematic views for illustrating another constitution of a mold according to the present invention.

The mold according to the present invention includes a first outer peripheral portion 6000 in a curved shape and a second outer peripheral portion 6100 in a linear shape, as shown in FIG. 6A.

Herein, the curved shape means, e.g., an outer peripheral shape of a wafer (work), i.e., an arcuate shape.

Figure 6B:
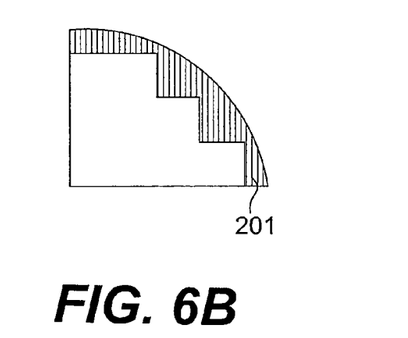
Figure 6C:
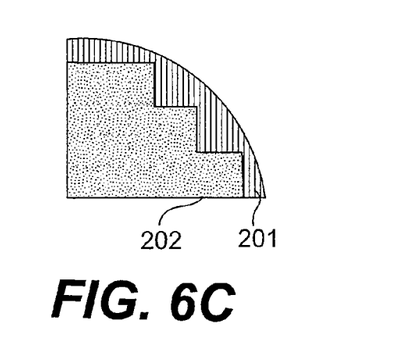

Incidentally, the mold shown in FIGS. 6A to 6C is not a mold corresponding to an entire outer periphery of a wafer, but may also be a mold corresponding to the entire outer periphery of the wafer.

In the present invention, it is important that a mold for forming a pattern in a peripheral area is used separately from a mold for forming a pattern in the neighborhood of a central portion of a member to be processed or a work, such as a wafer or a resin on the wafer.

Figure 8:
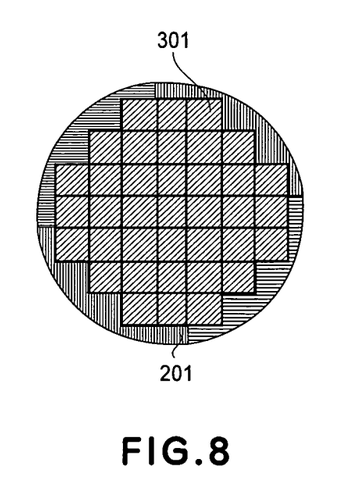
FIG. 8 is a schematic view for illustrating another work after being processed in the present invention.

Accordingly, the mold of the present invention also embraces a mold having an outer peripheral pattern corresponding to pattern group (e.g., a pattern group comprising a rectangular pattern shown in FIG. 8) constituted by a plurality of pattern surfaces each having a rectangular outer peripheral portion.

Figure 9:
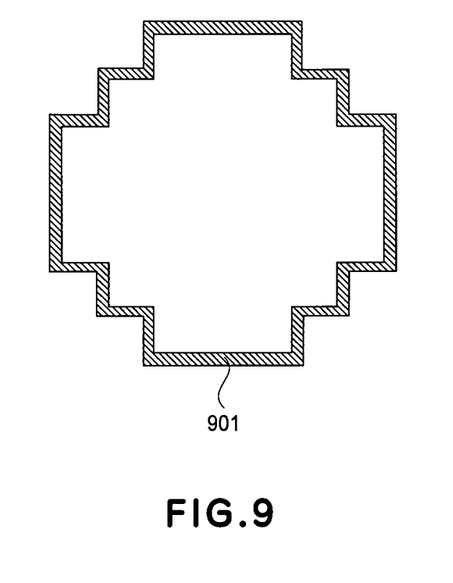
FIGS. 9, 10A to 10C, and 11 are schematic views for illustrating patterns of molds in the present invention.

Further, the mold may also have an elongated rectangular shape, as shown in FIG. 9. In FIG. 9, a peripheral pattern 901 is formed so that an inside shape thereof corresponds to the outer peripheral shape of the above-described pattern group. In other words, the outer peripheral shape and the peripheral pattern 901 are fitted with each other.

Figure 10A:
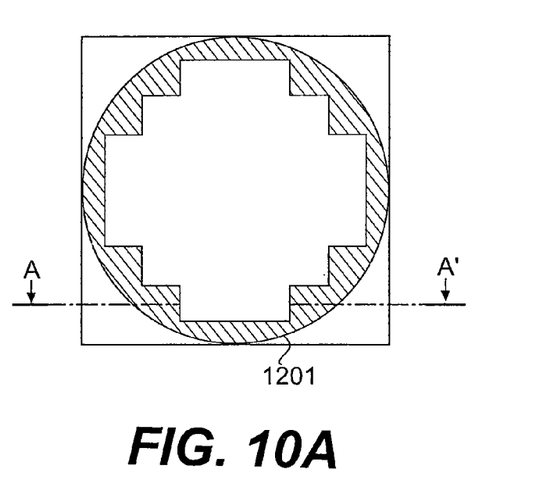
Figure 10B:
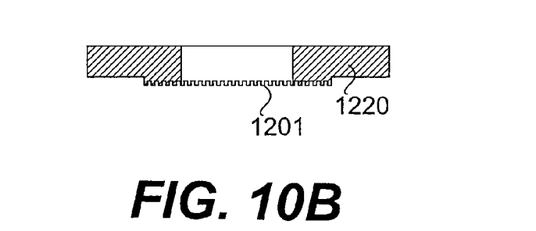
Figure 10C:
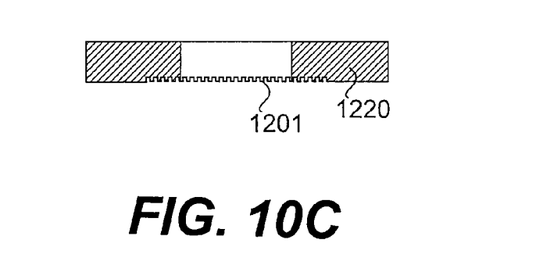

Further, as shown in FIGS. 10A to 10B, a peripheral area may have a shape corresponding to an outer peripheral shape of a wafer and an outer shape of the mold may also have other shapes, such as a rectangle, and so on. In FIGS. 10A to 10C, a peripheral pattern 1201 is formed.

In this case, an outer area 1220, as shown in FIGS. 10B and 10C showing a cross section of the mold having the peripheral pattern 1201, may be a recessed area (FIG. 10B) or a leveled area (FIG. 10C).

Figure 11:
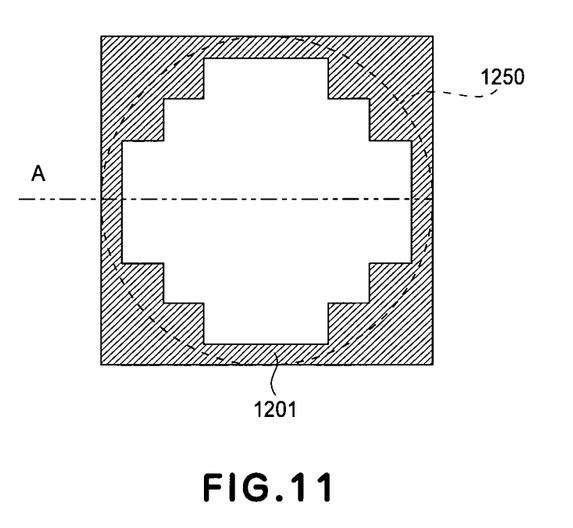

Further, in a case when breakage of a mold at a wafer outer peripheral portion is not problematic, as shown in FIG. 11, the mold may also have a peripheral area larger in size than an outer peripheral shape 1250 (indicated by a dotted line for convenience of explanation) of the wafer. This case is, e.g., one such that a mold for pattern formation in the peripheral area is more inexpensive than the above-described mold for forming the pattern group.

Embodiments of a Production Process

The process of producing a member having a pattern according to an embodiment of the present invention is realized in the following manner.

Figure 3:
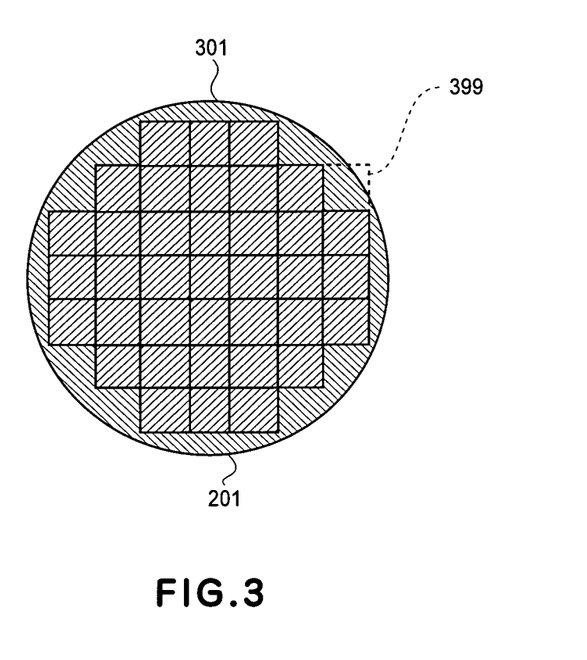
FIG. 3 is a schematic view for illustrating a work after being processed in the present invention.

First of all, a first mold having a first pattern and a second mold having a second pattern, including an outer peripheral portion having a shape corresponding to a shape of an outer peripheral portion of the first pattern, are prepared. Then, in a peripheral area, of a member to be processed, including an area not large enough to transfer an entire first pattern of the first mold (e.g., an area 399 shown in FIG. 3 or FIG. 4B), the second pattern (a peripheral pattern 201) is transferred. Further, inside the peripheral area, the first pattern (e.g., a pattern 301 shown in FIG. 3) is transferred. The first pattern may be a pattern group comprising a plurality of pattern units (e.g., each indicated by reference numeral 301 shown in FIG. 3). In this manner, the process for producing the member having a pattern is realized.

Incidentally, the order of formation of the first pattern and the second pattern can be appropriately selected. Further, in this embodiment, the peripheral area does not mean only the area not large enough to transfer an entire first pattern of the first mold, but means an area including such an area.

Particularly, the above-described first pattern and a second pattern may preferably be provided adjacent to each other at a spacing identical to a spacing between adjacent portions of the first pattern. Further, in a case when an outer peripheral portion of the first pattern is constituted by straight line segments (e.g., a rectangle), an outer peripheral portion of the second pattern may preferably be constituted by a combination of a straight line corresponding to the outer peripheral portion of the first pattern and a curved line corresponding to a peripheral edge portion of the above-described member.

Further, it is also possible to realize a process of producing a member having an unevenness according to this embodiment through the following steps. More specifically, the production process includes a first step of preparing a first mold, which is provided with a first uneven pattern at a surface thereof and an outer peripheral portion, constituted by straight line segments, of the first uneven pattern surface, a second step of preparing a second mold, which is provided with a second uneven pattern, at a surface thereof, having an outer peripheral portion including a first outer peripheral portion constituted by a curved line and a second outer peripheral portion constituted by straight line segments corresponding to the outer peripheral portion of the first uneven portion surface, and a third step of transferring the first uneven portion and the second uneven portion onto a member to be processed. The first step and the second step may be performed in any order or substantially at the same time.

The above-described member to be processed is a wafer, such as a silicon wafer used in a semiconductor production process or a resin-surfaced wafer. In addition to these wafers, as the wafer, it is also possible to use a glass plate, a metal plate, quartz, etc.

The uneven pattern of the mold can be transferred onto the wafer itself or the resin on the wafer. Examples of the resin may include a thermosetting resin, a photocurable resin, such as an ultraviolet curable resin, and a thermoplastic resin.

Herein, as described above, the member to be processed is also referred to as a "work" in some cases.

The first mold is, e.g., a mold having an outer peripheral portion constituted by segments of a rectangle (such as a quadrangle, a rectangle, or a square) in a peripheral area of a pattern-formed surface. As the second mold, it is possible to employ the mold described in the Embodiments of a mold.

In the above-described third step, in an outer peripheral area 302, shown in FIG. 4B, a pattern is transferred with the above-described second mold. Thereafter, in an area inside the outer peripheral area, a pattern can be transferred with the above-described first mold. In this case, the pattern formation is first performed in the outer peripheral area, so that it is possible to decrease a possibility that the entire member is a defective item, e.g., due to an imprint error in the peripheral area in a step subsequent to large-area pattern formation in the inner (inside) area by a plurality of nano-imprint operations.

In the inner area, e.g., pattern transfer with the first mold is performed plural times to realize a pattern 301.

It is also possible to transfer the pattern in the outer peripheral area after transferring the pattern in the inner area. In this case, it is possible to obviate an adverse affect in the inner area when contamination, or the like, is caused to occur during the imprint at the wafer peripheral portion and adversely affects the imprint in the inner area. Incidentally, also in the case of transferring the pattern in the outer peripheral area, it is possible to perform a plurality of transfer operations after the peripheral area is appropriately divided into plural areas. During the plural times of transfer, it is possible to effect pattern formation with a single mold for the outer peripheral area by rotating the above-described member.

Incidentally, the pattern referred to herein is, e.g., an uneven pattern comprising projections and recesses.

In another embodiment, the production process of a member having a pattern according to the present invention can be realized through the following steps. More specifically, the production process includes a step of forming a second pattern in a peripheral area of a member to be processed and a step of transferring a first pattern plural times with a mold having the first pattern in an area located inside the peripheral area of the member to be processed. Here, the second pattern forming step may preferably be a step of forming the pattern after the peripheral area of the member to be processed is divided into a plurality of areas. In this case, the production process may also further include a step of rotating the member to be processed.

In another embodiment, the production process of a member having a pattern according to the present invention can be realized in such a manner that a second pattern corresponding to an outer peripheral shape of a pattern group before or after the pattern group is formed by transferring a first pattern of a mold plural times onto a flat plate (sheet-like) member. In this case, onto the flat plate-like member (e.g., a wafer provided with a surface resin layer as a pattern forming layer), the first pattern is transferred plural times, so that the first pattern does not overlap with each other. Then, the second pattern corresponding to the outer peripheral shape of the pattern group is transferred in the peripheral area of the member. The second pattern is not necessarily required to be transferred onto the entire surface of the peripheral area, but it is important that the second pattern is formed, so as to be disposed adjacent to the above-described pattern group.

Incidentally, the formation of the second pattern in the peripheral area is suitably performed by imprinting with a mold, but can also be performed by photolithography using an exposure apparatus.

The second pattern may preferably be provided adjacent to the pattern group at a spacing therebetween identical to a spacing between adjacent portions for the first pattern constituting the pattern group. Further, after the pattern group is formed, the second pattern may be formed. It is also possible to form the pattern group after the second pattern is formed. Further, the second pattern may also be formed during the formation of the pattern group.

Herein, the term "corresponding to the outer peripheral shape of the pattern group" means that a pattern shape extends along at least a part of the outer peripheral shape of the pattern group. Further, the first pattern and the second pattern described above are formed with molds different from each other. The above-described production process may preferably be performed so that a pattern surface shape of the first pattern (a shape in a case when the shape is regarded as a surface shape without considering minute unevenness) and the pattern surface shape of the second pattern are different from each other. However, it is also possible to perform the production process so that these pattern surface shapes are substantially identical to each other. In this case, the outer peripheral pattern formed on the wafer is a dummy pattern.

Embodiments of a Pattern Transfer Apparatus

The pattern transfer apparatus according to an embodiment of the present invention is constituted as described below.

Figure 1:
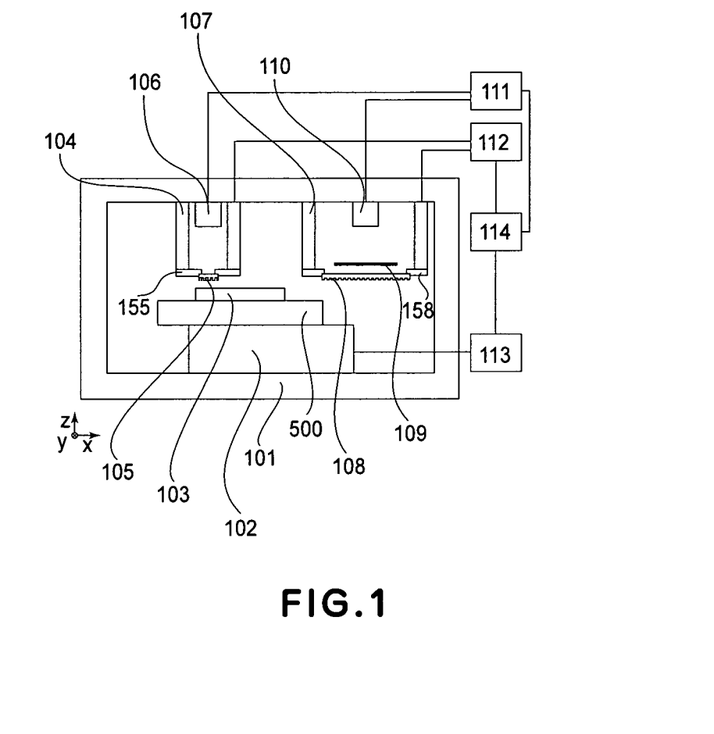
FIG. 1 is a schematic view for illustrating a constitution of a pattern transfer apparatus according to the present invention.

For example, as shown in FIG. 1, the pattern transfer apparatus includes a first mold holding portion 155 for holding a first mold 105 for forming a pattern inside a peripheral area of a flat plate-like member and a second mold holding portion 158 for holding a second mold 108 for forming a pattern in the peripheral area.

Here, a mechanism for supporting a member to be processed (work) is ensured by a first support portion (500 shown in FIG. 5) provided at a position opposite to the first mold holding portion and a second support portion (520 shown in FIG. 5) provided at a position opposite to the second mold holding portion. Particularly, it is preferable that the first support portion is configured to have a mechanism for moving the flat plate-like member in an in-plane direction and the second support portion is configured to have a mechanism for moving the flat plate-like member in the in-plane direction.

Incidentally, on a side where the second mold holding portion is provided, it is preferable that a light-blocking means for preventing light irradiation with respect to a central area of the flat plate-like member is provided. Further, the peripheral area means an area, e.g., in which an entire surface of a pattern of the first mold cannot be transferred.

In this embodiment, separately from the first mold (for ordinary pressure application processing), a peripheral shot mold for processing an outer peripheral area of the work is used. As a result, it is possible to process the entire area of the work, including the outer peripheral area, so that uniformity in other processes is improved, and it is also possible to form a test pattern, etc.

In this embodiment, the process of producing a member having an unevenness includes a step of processing the outer peripheral area of the work and a step of processing an area inside the outer peripheral area of the work, wherein these steps are performed by using different molds. Further, the mold used in the step of processing the outer peripheral area of the work may be configured to have a shape corresponding to an outer shape of the inner area of the work or a pattern corresponding to a pattern of the inner area of the work. In the production process, the step of processing the outer peripheral area of the work can be configured to include a process of dividing the outer peripheral area into a plurality of areas to be processed, thus reducing a production cost of the mold. In this case, the process for processing the outer peripheral area by the division can be constituted as a process wherein a plurality of divided molds is used, and a pattern shape formed on the divided molds is transferred onto the work while rotating the work to process the outer peripheral area of the work.

Further, the pressure processing apparatus in this embodiment may be configured to use a mold provided to the above-described outer peripheral area pressing means and a mold different from the mold provided in the area located inside the work. The mold provided to the outer peripheral area pressing means can be configured to have a shape corresponding to the outer shape of the area located inside the work or a pattern corresponding to the pattern of the area located inside the work. The mold provided to the outer peripheral area pressing means can be configured to have a shape divided into plural portions with respect to a pattern forming surface in the outer peripheral area, thus reducing a production cost thereof. In this embodiment, the production process of the member having an unevenness and the pressure processing apparatus described above may include not only the case of pressing the mold against the work (the member to be processed), but also, the case of pressing the work against the mold.

The present invention will now be described more specifically based on Embodiments. Herein, the term "in-plane direction" means an in-plane direction of a processing surface or an in-plane direction of a surface to be processed.

Embodiment 1

In Embodiment 1, a pressure processing apparatus according to the present invention is used.

FIG. 1 shows a constitution of the pressure processing apparatus. Referring to FIG. 1, the apparatus includes a housing 101 for covering the entire apparatus as desired, an x-y moving mechanism 102, a work 103 (also referred to as a flat plate-like member or a member to be processed), a pressing mechanism 104, a mold 105, a UV light source 106, a peripheral shot pressing mechanism 107, a peripheral shot mold 108, a light-blocking plate 109, a peripheral shot UV light source 110, an exposure control circuit 111, a pressing control circuit 112, a position control circuit 113, and a process control circuit 114.

First, an apparatus constitution in this embodiment will be described.

As shown in FIG. 1, the mold 105 and the peripheral shot mold 108 are disposed at pattern positions so that they are to be opposite to the work, prepared by coating a Si wafer with a photocurable resin, during an associated operation. The mold 105 is connected to the pressing mechanism 104 via a support portion 155, and the peripheral shot mold 108 is connected to the peripheral shot pressing mechanism 107 via a support portion 158. The work 103 is mounted on the x-y moving mechanism 102 via a jig. Further, the pressing mechanism 104, the peripheral shot pressing mechanism 107, and the x-y moving mechanism 102 are connected via the housing 101. On the housing 101, the UV light source 106 and the peripheral shot UV light source 110 are mounted at positions opposite to rear surfaces of the mold 106 and the peripheral shot mold 108, respectively. The light-blocking plate 109 is disposed between the peripheral shot mold 108 and the peripheral shot UV light source 110 and blocks an area to be processed with the mold 105 from irradiation of UV light from the peripheral shot UV light source.

The process control circuit 114 provides instructions to the exposure control circuit 111, the pressing control circuit 112, and the position control circuit 113 to perform the process and receives output data from these control circuits. The exposure control circuit 111 effects exposure by controlling the UV light source 106 and the peripheral shot UV light source 110. The pressing control circuit presses the mold 105, the peripheral shot mold 108, and the work 103, by controlling the pressing mechanism 104 and the peripheral shot pressing mechanism 107. The position control circuit 113 controls a position of the work 103 in an in-plane direction (x-y direction) by controlling the x-y moving mechanism 102. In the present invention, however, mechanical arrangement of the respective axes may appropriately be changed as a matter of design choice.

Next, the molds in this embodiment will be described.

Figure 2A:
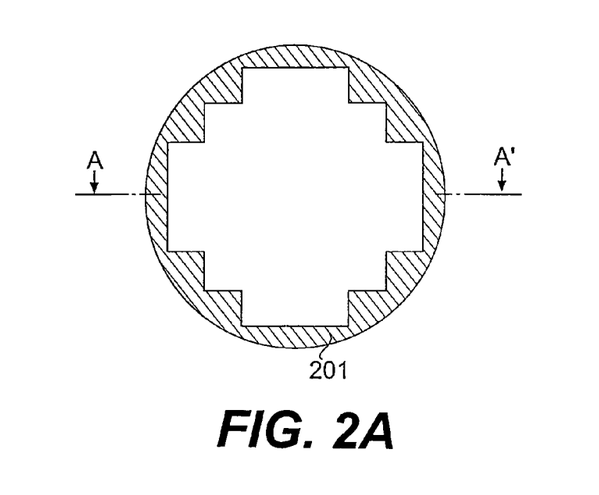
FIGS. 2A to 2D are schematic views for illustrating a constitution of a mold according to the present invention.

FIG. 2A is a schematic view of the peripheral shot mold 108, shown in FIG. 1, when the peripheral shot mold 108 is viewed in the z direction in FIG. 1, wherein a peripheral pattern 201 is formed as an uneven pattern at a hatched portion. A shape of the peripheral pattern 201 may be appropriately determined depending on a processing method, costs, etc. Examples thereof may include a line-and-space shape and a dot shape. However, from the viewpoint of uniformity in other processes, such as dry etching and ion implantation, it is desirable that a process rule is approximately not more than three times that of the mold 105. Further, with respect to an areal ratio and a depth of unevenness, it is desirable that they are approximately equal to those in the case of the mold 105. Further, in the peripheral area, it is also possible to form a test pattern for monitoring other processes and device characteristics. An outer shape of the peripheral pattern 201 is a circular shape corresponding to that of the work 103. This shape is suitable for such a case that a base material for the peripheral shot mold 108 has the same specification as that of the outer shape of the work 103, and is available. However, the outer shape of the peripheral pattern 201 may also be another shape, such as a stripe shape with a certain width from the inner portion. Further, as shown in FIG. 9, the peripheral shot mold 108 may also have the peripheral pattern 201 having a circular outer shape corresponding to the outer shape of the work 103 and an entire outer shape thereof may be a rectangle, or the like. Further, in a case when breakage of the peripheral pattern 201 at a peripheral edge portion of the work 103 is not a problem, it is also possible to use a mold having a larger forming area of the peripheral pattern 1201 than the outer shape of the work 1250, as shown in FIG. 11. Particularly, in a case when the peripheral shot mold 108 is forced to be cut from a base material, the outer shape constituted by straight line segments reduces the processing cost.

The inner shape of the peripheral pattern 201 is prepared in accordance with the outer shape of the area to be processed with the mold 105. More specifically, the size of the inner shape of the peripheral pattern 201 is designed to be somewhat larger than the mold 105, in order to obviate overlapping with the above-described area and is determined appropriately depending on a line width of a scribe line (for cutting a chip), an accuracy of the x-y moving mechanism 102, and accuracy of mounting of the work 103, etc. The peripheral shot mold 108 may also be prepared by reutilizing the mold 105 after replacing the mold 105 with another mold 105 having a different pattern, when an outer shape of a pattern forming area has a target shape (in this case, an outer shape of the area to be processed with the mold 105).

Figure 2B:
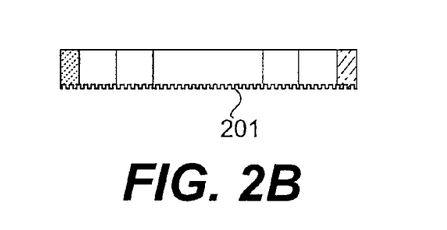
Figure 2C:
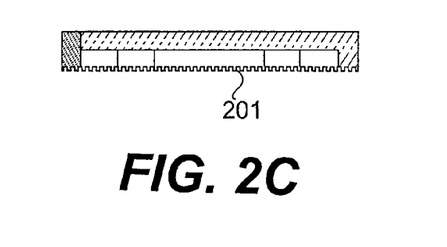
Figure 2D:
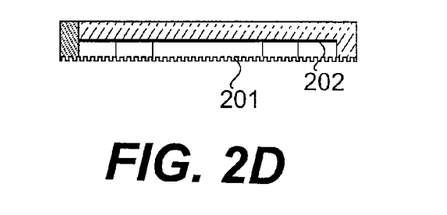

FIGS. 2B, 2C and 2D are schematic sectional views of line A-A' shown in FIG. 2A. In these figures, hatched lines indicate cut surfaces.

An area inside the peripheral pattern 201 may be formed in a full thickness (height) of the mold, as shown in FIG. 2B, or may be recessed from the pattern forming surface of the peripheral pattern 201, as shown in FIG. 2C. Further, as shown in FIG. 2D, in the inner (inside) area, a light-blocking film 202 formed of a light-blocking material, such as a metal (e.g., Cr, Ta, Au, Ni, Al, W, Ti, alloys of these metals, or a nonmetal compound), carbon black, or a coolant by vapor deposition or coating is formed to be used instead of the light-blocking plate 109, thus omitting the use of the light-blocking plate 109. In this case, a spacing between the light-blocking member and the processing surface can be decreased, so that it is easy to improve a shape accuracy of the light-blocking area.

The mold 105 is an ordinary mold for pressing processing formed of a transparent member provided with a desired target shape at a surface thereof. Examples of materials for both of the molds 105 and 108 may include light-transmission materials, such as quartz glass or sapphire, which are appropriately selectable.

Further, FIGS. 10B and 10C are schematic sectional views of line A-A' shown in FIG. 10A, wherein hatched lines indicate cut surfaces. An area outside a peripheral pattern 1201 may be recessed from the pattern forming surface, as shown in FIG. 10B, or may be leveled with the pattern forming surface, as shown in FIG. 10C. Particularly, in the latter case (FIG. 10C), a mold preparing step can be simplified to reduce the processing cost when a sufficient processing depth at a peripheral edge portion of the work 103 can be ensured, or when only a processing depth in the neighborhood of the pattern 301 described above is necessary in order to ensure uniformity of the process, as described above.

Next, the pressing processing process in this embodiment will be described.

First, the work 103 is mounted on the x-y moving mechanism 102 and is positioned by being moved immediately under the peripheral shot mold 108.

Then, the peripheral shot mold 108 is pressed against the work 103 and the work 103 is irradiated with UV light to cure a photocurable resin at a portion of the work 103 contacting the peripheral pattern 201 of the mold 108. Thereafter, the peripheral shot mold 108 is released from the work 103 to transfer the peripheral pattern 201 onto the work 103.

Next, the work 103 is moved below the mold 105 and the mold 105 is pressed against the work 103 inside the area in which the peripheral pattern 201 is formed, followed by UV light irradiation of the work 103 to cure the photocurable resin of the work 103. Thereafter, the mold 105 is released from the work 103 to transfer the pattern 301 onto the work 103. This operation is repeated to effect pattern formation in the area.

Through the above-described steps, the work 103, having the pattern 301-formed area for the target shape, and the peripheral pattern 201, surrounding the area, is completed.

Incidentally, in this embodiment, the pattern 301 is formed after the peripheral pattern 201 is formed, but may also be formed before the peripheral pattern 201 is formed. Further, the constitution can also be simplified by omitting the use of the light-blocking plate 109 or the light-blocking film 202 in the case when excessive UV light exposure after the formation of the pattern 301 is permitted or the case when a resin is coated every time of pattern formation, irrespective of the order of pattern formation, depending on a characteristic of the resin or a specification of shape after the processing. Further, in this embodiment, as the processing method, a method is utilized wherein the photocurable resin is cured by UV light, but it is also possible to employ other shape transfer methods, such as a thermosetting method using a thermosetting resin, a method wherein a thermoplastic resin is softened under heating, a method wherein a pressure is applied to a high-viscosity resin at normal temperature, and a method wherein an ink layer, a resin layer, or a metal layer formed on a mold is transferred onto the work.

In this embodiment, the pressing processing apparatus includes an integral mechanism for forming the pattern 301 and the peripheral pattern 201, but may also be configured to be separate apparatuses for forming these patterns, respectively, although cost and time for conveyance of the work are increased.

Embodiment 2

In Embodiment 2, a pressing processing apparatus, different in constitution from that of Example 1, according to the present invention, is used.

Figure 5:
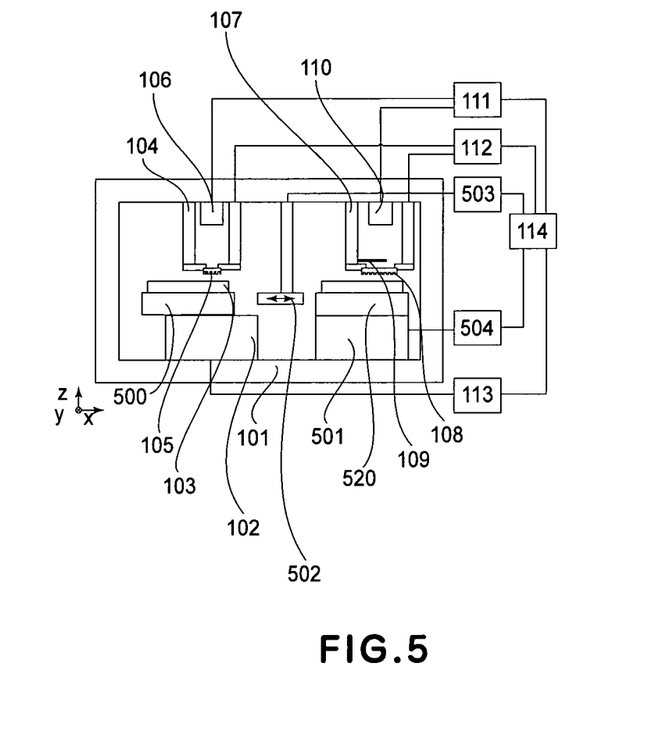
FIG. 5 is a schematic view for illustrating another constitution of a pattern transfer apparatus according to the present invention.

FIG. 5 shows the constitution of the pressing processing apparatus of this embodiment. In FIG. 5, the same members or means as those in Embodiment 1 are indicated by the same reference numerals, thus omitting explanation for a common constitution.

The constitution of this embodiment is basically different from that of Embodiment 1 in that a rotation mechanism 501 for rotating the work 103 is disposed immediately below the peripheral shot mold. The different point is that a conveyance mechanism 502 for conveying the work 103 is disposed between the x-y moving mechanism 102 and the rotation mechanism 501, and is controlled by a conveyance mechanism 503. The process control circuit 114 also provides instructions to the conveyance control circuit 503 and the rotation control circuit 504 to effect the processing, and receives output data from these control circuits.

Molds used in this embodiment will now be described.

In this embodiment, as the peripheral shot mold 108, a peripheral shot mold 108 is prepared by dividing and cutting the peripheral shot mold 108 described in Embodiment 1. FIGS. 6A, 6B and 6C show a (cut) shape of the peripheral shot mold 108 in this embodiment when the peripheral shot mole 108 is viewed in the z direction shown in FIG. 5. The shapes of the peripheral shot mold 108 shown in FIGS. 6A, 6B and 6C are those corresponding to shapes of portions prepared by dividing the peripheral shot molds 108, shown in FIGS. 2B, 2C and 2D, into four portions and cutting the four portions into ¼ size portions, respectively, under a rotation symmetry condition about a normal axis with respect to a forming surface of the peripheral pattern 201.

Next, the pressing processing process in this embodiment will be described with reference to FIG. 7.

Figure 7:
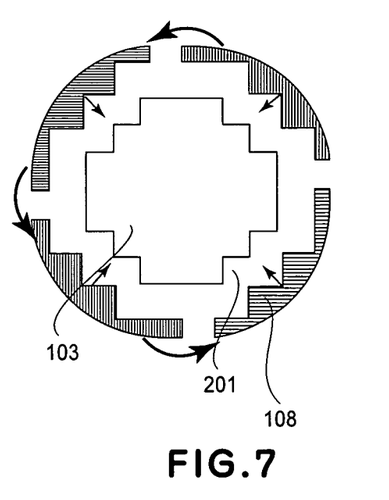
FIG. 7 is a schematic view for illustrating a processing process in the present invention.

Referring to FIG. 7, the work 103 is mounted on the rotation mechanism. Then, the peripheral shot mold 108 is pressed against the work 103, and the work 103 is irradiated with UV light to cure a photocurable resin of the work 103 at a portion contacting the peripheral pattern 201. Thereafter, the peripheral shot mold 108 is released from the work 103 to transfer the peripheral pattern 201 onto the work 103. Next, the work 103 is rotated about a center thereof at an angle of $\pi/2$ radians around the z axis shown in FIG. 5 to similarly transfer the peripheral pattern 201 onto the work 103. This operation is further repeated two times to complete formation of the peripheral pattern 201 in a peripheral pattern forming area constituted by four (divided) areas.

In this embodiment, the work is rotated, but this rotation is relative rotation, so that FIG. 7 shows a state in which the work 103 is fixed, for convenience of explanation. It is needless to say that a similar effect can be achieved by rotating the peripheral shot mold 103 while changing the positional arrangement of the rotation mechanism 501.

Next, the work 103 is conveyed and mounted on the x-y moving mechanism 102 by means of the conveyance mechanism 502, and then, repetitive formation of the pattern 301 is performed similarly as in Embodiment 1. As a result, the work 103 constituted by the Pattern 301-formed area having a target shape and the peripheral pattern 201-formed area consisting of four (divided) areas is completed.

Incidentally, the manner of division of the peripheral shot mold in the present invention is not limited to that in this embodiment, but may also be a ½ division manner or the ¼ division manner. It is also possible to divide the peripheral shot mold 108 into five or more portions or asymmetrical portions. In these cases, the processing is effected by using the plurality of portions of the peripheral shot mold 108 at the same time or at separately plural times. Further, depending on the shape before the division and the manner of division, the x-y moving mechanism 102 is used in place of the conveyance mechanism 501.

Further, similarly as in Embodiment 1, the mechanical arrangement of the respective axes is not restricted to that in this embodiment, but may appropriately be changed as a matter of design choice.

Further, in this embodiment, the apparatus constitution is also divisible as separate apparatuses.

The constitution of this embodiment is increased in the number of pattern forming steps for the peripheral pattern 201 when compared with that of Embodiment 1, thus resulting in a decreased throughput. However, the peripheral shot mold 108 can be reduced in size, so that it is possible to reduce the cost of the molds.

While the invention has been described with reference to the structure disclosed herein, it is not confined to the details set forth, and this application is intended to cover such modifications or changes as may come within the purpose of the improvements or the scope of the following claims.

What is claimed is:
1. A patterning process comprising the steps of:
   preparing a first mold having a first uneven pattern at a patterning surface thereof;
   preparing a second mold as a peripheral shot mold having a second uneven pattern at a patterning surface thereof;

providing a wafer comprising a peripheral area along an entire peripheral edge thereof and having a non-peripheral area positioned inside the peripheral area and spaced from the peripheral edge;

using the first mold to imprint a non-peripheral pattern group positioned completely within the non-peripheral area, the non-peripheral pattern group comprising a plurality of non-peripheral pattern units each corresponding to an individual imprint of the first mold; and using the second mold to imprint a peripheral pattern positioned completely within the peripheral area, the second mold and peripheral pattern each comprising a shape having straight line segments corresponding to and outlining corners of a plurality of the non-peripheral pattern units and each having a curved line corresponding to the peripheral edge of the wafer, wherein the peripheral area is not large enough to imprint an entire non-peripheral pattern unit.

2. A process according to claim 1, wherein at least some of the non-peripheral pattern units are imprinted adjacent to one another.

3. A process according to claim 2, wherein the peripheral pattern is spaced from the non-peripheral pattern group by a distance that is identical to a spacing between adjacent non-peripheral pattern units.

4. A process according to claim 1, wherein the peripheral pattern includes a plurality of peripheral pattern units, and at least some of the peripheral pattern units are imprinted adjacent to one another.

5. A process according to claim 1, wherein the peripheral pattern includes a plurality of peripheral pattern units, and the process further comprises rotating the wafer about a center thereof between imprints of each peripheral pattern unit.

6. A process according to claim 1, wherein the peripheral pattern is imprinted after the non-peripheral pattern group is imprinted.

7. A process according to claim 1, wherein the non-peripheral pattern group is imprinted after the peripheral pattern is imprinted.

8. A process according to claim 1, wherein the wafer has a flat, plate-like shape.

9. A process according to claim 1, wherein the wafer has a circular shape.

10. A method according to claim 1, wherein each non-peripheral pattern unit is rectangular.

* * * * *